US011082011B1

(12) United States Patent
Bonen (10) Patent No.: US 11,082,011 B1
(45) Date of Patent: Aug. 3, 2021

(54) RF POWER AMPLIFIER PERFORMANCE BY CLIPPING PREVENTION OF LARGE PAPR SIGNALS

(71) Applicant: Harmonic, Inc., San Jose, CA (US)

(72) Inventor: Adi Bonen, Belle Mead, NJ (US)

(73) Assignee: Harmonic, Inc., San Jose, CA (US)

( * ) Notice: Subject to any disclaimer, the term of this patent is extended or adjusted under 35 U.S.C. 154(b) by 0 days.

(21) Appl. No.: 16/780,147

(22) Filed: Feb. 3, 2020

Related U.S. Application Data

(60) Provisional application No. 62/802,446, filed on Feb. 7, 2019.

(51) Int. Cl.
| | |
|---|---|
| *H04L 25/49* | (2006.01) |
| *H03F 1/32* | (2006.01) |
| *H03F 3/19* | (2006.01) |
| *H03G 11/02* | (2006.01) |
| *H04L 27/26* | (2006.01) |
| *H04L 27/34* | (2006.01) |
| *G01R 19/165* | (2006.01) |
| *H04B 10/2575* | (2013.01) |
| *H04B 10/2507* | (2013.01) |
| *H01L 29/872* | (2006.01) |
| *H04H 60/96* | (2008.01) |
| *H03F 3/24* | (2006.01) |
| *H04B 10/25* | (2013.01) |

(52) U.S. Cl.
CPC .......... *H03F 1/32* (2013.01); *G01R 19/16528* (2013.01); *H01L 29/872* (2013.01); *H03F 3/19* (2013.01); *H03F 3/245* (2013.01); *H03G 11/02* (2013.01); *H04B 10/2507* (2013.01); *H04B 10/25751* (2013.01); *H04B 10/25891* (2020.05); *H04H 60/96* (2013.01); *H04L 27/2623* (2013.01); *H04L 27/3411* (2013.01); *H03F 2200/198* (2013.01); *H03F 2200/372* (2013.01); *H03F 2201/32* (2013.01)

(58) Field of Classification Search
CPC ....... H03F 1/3247; H03F 3/24; H04L 27/368; G06F 2212/2146
USPC .................................................. 375/297, 260
See application file for complete search history.

(56) References Cited

U.S. PATENT DOCUMENTS

| | | |
|---|---|---|
| 6,188,274 B1 | 2/2001 | Vernon |
| 7,627,046 B1 | 12/2009 | Dick et al. |
| 10,686,621 B1 * | 6/2020 | Frozenfar ............... H04L 5/001 |

(Continued)

*Primary Examiner* — Khai Tran
(74) *Attorney, Agent, or Firm* — Brokaw Patent Law PC; Christopher J. Brokaw (57) ABSTRACT

Preventing RF signal distortion and signal error producing memory events in a Radio Frequency (RF) power amplifier (RFPA). An element, disposed prior to the Radio Frequency (RF) power amplifier (RFPA) in a signal path of a RF signal input to the RFPA, may enforce a maximum allowable amplitude in a high PAPR instantaneous high peak of the RF signal. An element may also increase or supplement a bias of the Radio Frequency (RF) power amplifier (RFPA) when a high PAPR instantaneous high peak is detected in the RF signal prior to receipt by the RFPA. Additionally, a first element operable detects when an instantaneous output voltage of the Radio Frequency (RF) power amplifier (RFPA) is below a predetermined voltage, and in response, a second element supplies additional current to prevent the output voltage of the RFPA from falling below a predetermined threshold voltage.

20 Claims, 11 Drawing Sheets

(56) References Cited

U.S. PATENT DOCUMENTS

| | | |
|---|---|---|
| 2002/0094791 A1 | 7/2002 | Pehike et al. |
| 2004/0170228 A1* | 9/2004 | Vadde ................. H04L 27/2602 375/260 |
| 2008/0143444 A1 | 6/2008 | Liu et al. |
| 2011/0182339 A1 | 7/2011 | Kang et al. |
| 2011/0316623 A1 | 12/2011 | Bohn et al. |
| 2014/0077875 A1 | 3/2014 | Wang et al. |
| 2014/0169188 A1 | 6/2014 | Arambepola et al. |
| 2014/0210540 A1 | 7/2014 | Mori et al. |
| 2015/0004923 A1 | 1/2015 | Beaudin |
| 2017/0272037 A1 | 9/2017 | de Vreede et al. |
| 2018/0183387 A1* | 6/2018 | Schemmann ......... H03F 1/0222 |
| 2019/0386624 A1* | 12/2019 | Ye ........................ H03F 1/3211 |

* cited by examiner

RF POWER AMPLIFIER PERFORMANCE BY CLIPPING PREVENTION OF LARGE PAPR SIGNALS

CLAIM OF PRIORITY

The present application claims priority to U.S. Provisional Patent Application No. 62/802,446, entitled "Improving RF Power Amplifiers Performance By Clipping Prevention of Large PAPR Signals," filed Feb. 7, 2019, the disclosure of which is hereby incorporated by reference for all purposes in its entirety as if fully set forth herein.

FIELD OF THE INVENTION

Embodiments of the invention generally relate to a Radio Frequency (RF) power amplifier (RFPA).

BACKGROUND

The peak voltage of a pure continuous wave (CW) signal is only $\sqrt{2}$ higher than its average root mean square (rms) voltage, exhibiting a peak to average power ratio (abbreviated as PAPR and expressed in dB) of 3 dB. A signal composed of N independent equal amplitude CW's has a maximum peak value of $N \times \sqrt{2}$ of the average rms value of one CW, and an rms value of $\sqrt{N}$ times the single CW average value. Thus, the maximum PAPR of that signal is $20 \times \log 10(N \times \sqrt{(2/N)}) = 10 \times \log 10(N) + 3$ dB.

As can be appreciated from this mathematical expression, PAPR grows logarithmically with the number of CW's. The probability for encountering such a high peak value is extremely small. For example, if N=30, while the max PAPR could be ~18 dB, the probability that the peak of all independent CWs will align within ±5 degrees is $(10/360)^{29} = 7 \times 10^{-46}$.

When a RF signal is composed of multiple QAM carriers, the same equation can be used by using a single QAM carrier PAPR to replace the 3 dB of a CW PAPR. In order to quantify the "reasonable to occur" PAPR value, one has to evaluate the rate at which the signal is sampled vs. the expected wait time for a peak to occur. For example, at a sample rate of 5 Gsps, $5 \times 10^9$ samples will be taken every second, making it very likely that a probability of $10^{-7}$ will occur in every wait period of 1 second, but very unlikely that a probability of $10^{-13}$ will occur in the same wait period.

The signal spectrum of several types of broadband communication schemes (such as without limitation wireless, cellular, Wi-Fi, and CATV) is composed of deep modulation carriers (for example, QAM and OFDM). Often, that spectrum is composed of multiple such carriers. As a result, the RF signal carried by these media can suffer from high PAPR.

High PAPR signals exhibit occasional very high instantaneous amplitude peaks which are much higher than the signal average value. Such behavior is commonly found in wideband communication signals such as those used in wireless, cellular, Wi-Fi, and CATV systems. The following example, evaluating the nature of a typical CATV signal, is representative of signals used by other communication systems. A reasonably occurring peak of a of a typical CATV signal (e.g., about once every second) can be ~17 dB higher than the signal average value. While the probability of such very high peak levels occurring in any single sample is very low, the probability of lower peak values is much higher. For example, for the same signal, the probability may go up to $10^{-4}$ for PAPR of about 12 dB.

Figure 1:
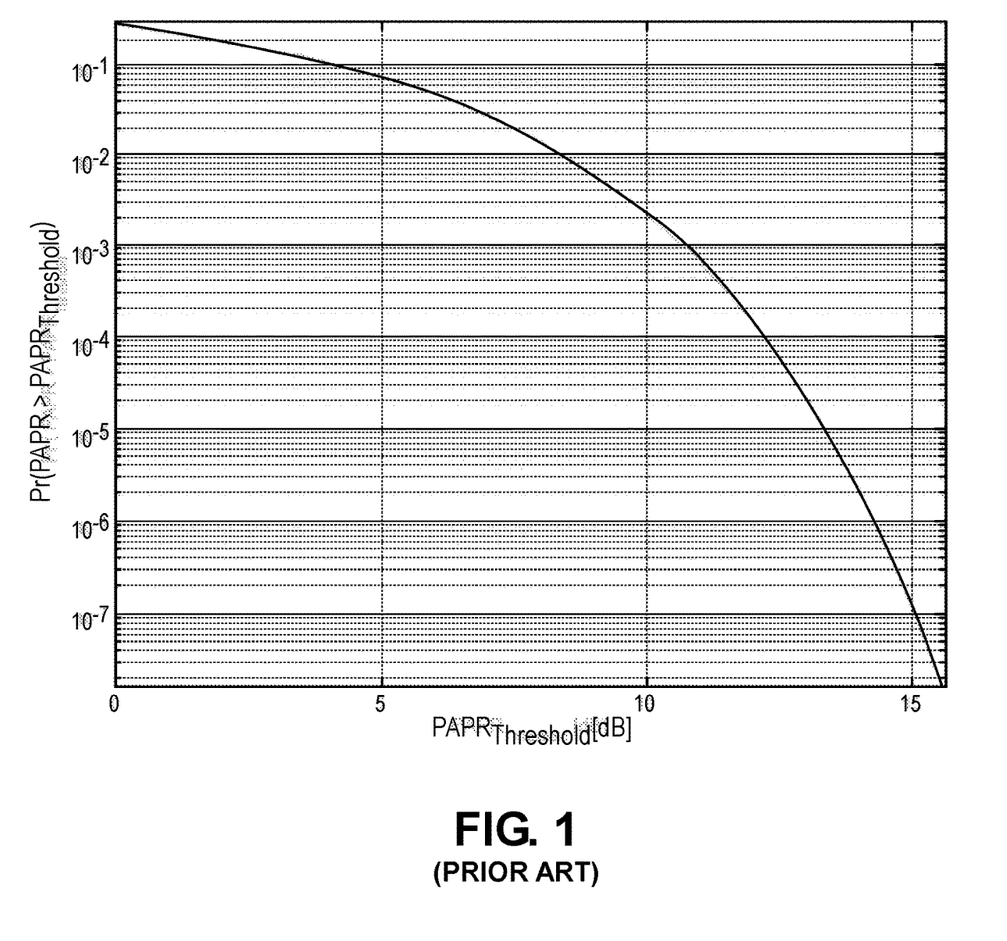
FIG. 1 illustrates such a PAPR plot for a typical CATV signal composed of 128x 6 MHz channels of 256-QAM modulation in accordance with the prior art.

It is customary to plot PAPR probability of a certain signal in a graph where the X axis represents $PAPR_{Threshold}$, and the Y axis represents the probability of any PAPR higher than that $PAPR_{Threshold}$. FIG. 1 illustrates such a PAPR plot for a typical CATV signal composed of 128×6 MHz channels of 256-QAM modulation in accordance with the prior art. As shown in FIG. 1, the probability of any PAPR higher than that $PAPR_{Threshold}$ is inversely proportional to the value of $PAPR_{Threshold}$.

The design of a communication device should account for the expected PAPR values of the signals it handles and their likelihood of occurrence by allowing reasonably high instantaneous peaks to be processed with no or minimal distortion by the various components in the signal path. For example, a back off of 16~17 dB is typically used in a DAC (digital to analog converter) that processes a broadband CATV signal. In other words, the root mean square of the signal is set to be 16~17 dB below the maximum signal amplitude that can be handled by the DAC (this maximum signal amplitude is also known as the DAC full scale). Amplifiers that are used to provide gain to a broadband CATV signal also are deployed with similar considerations in mind, albeit typically at a slightly lower back off amount.

Figure 2:
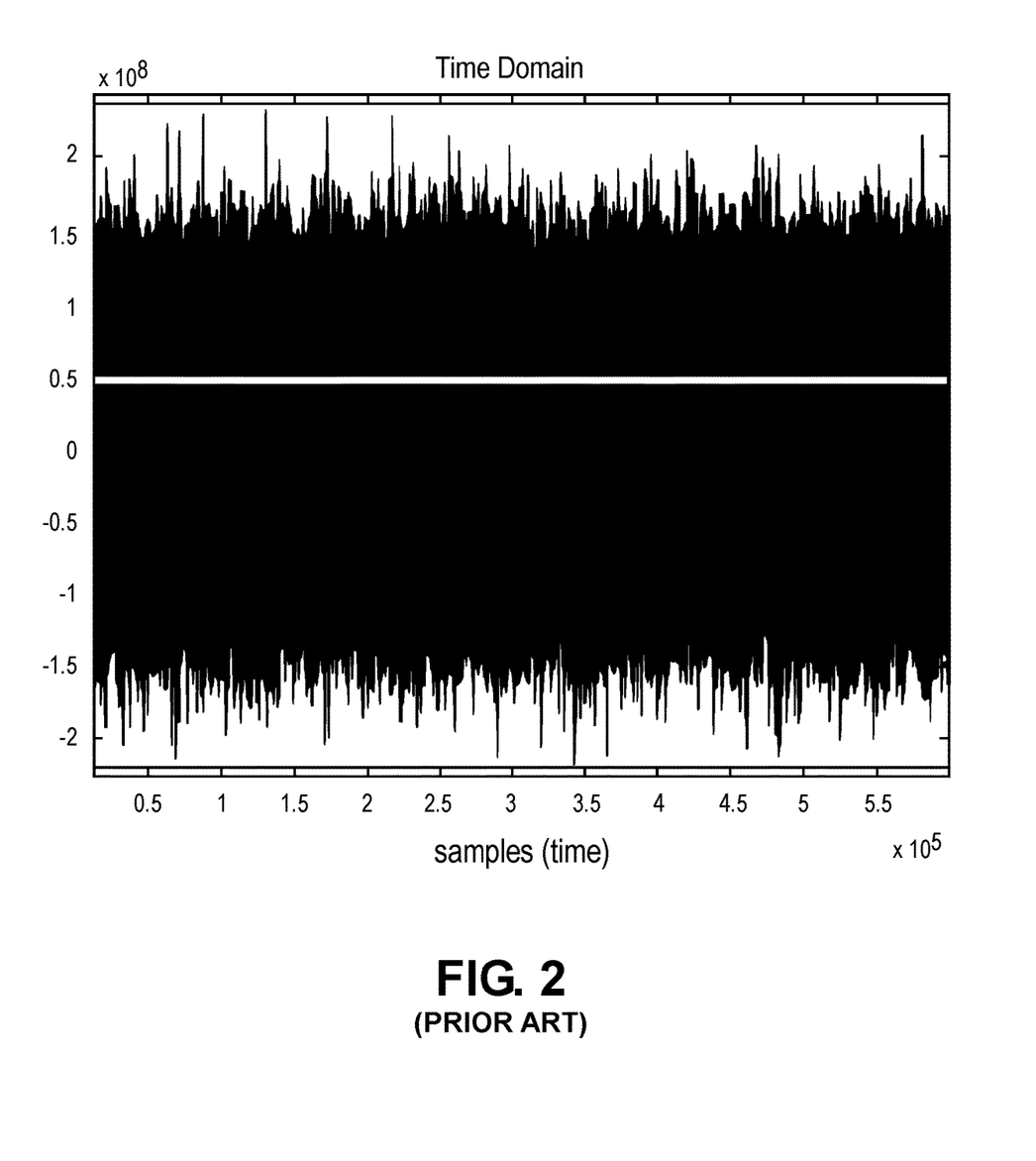
FIG. 2 illustrates a time domain linear plot of a typical CATV(t) signal composed of 128x 6 MHz channels of 256-QAM modulation in accordance with the prior art.

FIG. 2 is a time domain linear plot of a typical CATV(t) signal composed of 128×6 MHz channels of 256-QAM modulation in accordance with the prior art. FIG. 2 depicts about 600,000 digital samples of a 768 MHz broad signal sampled at about 2.5 Gsps. Note that the signal shown in FIG. 2 has both positive and negative peaks.

Figure 3:
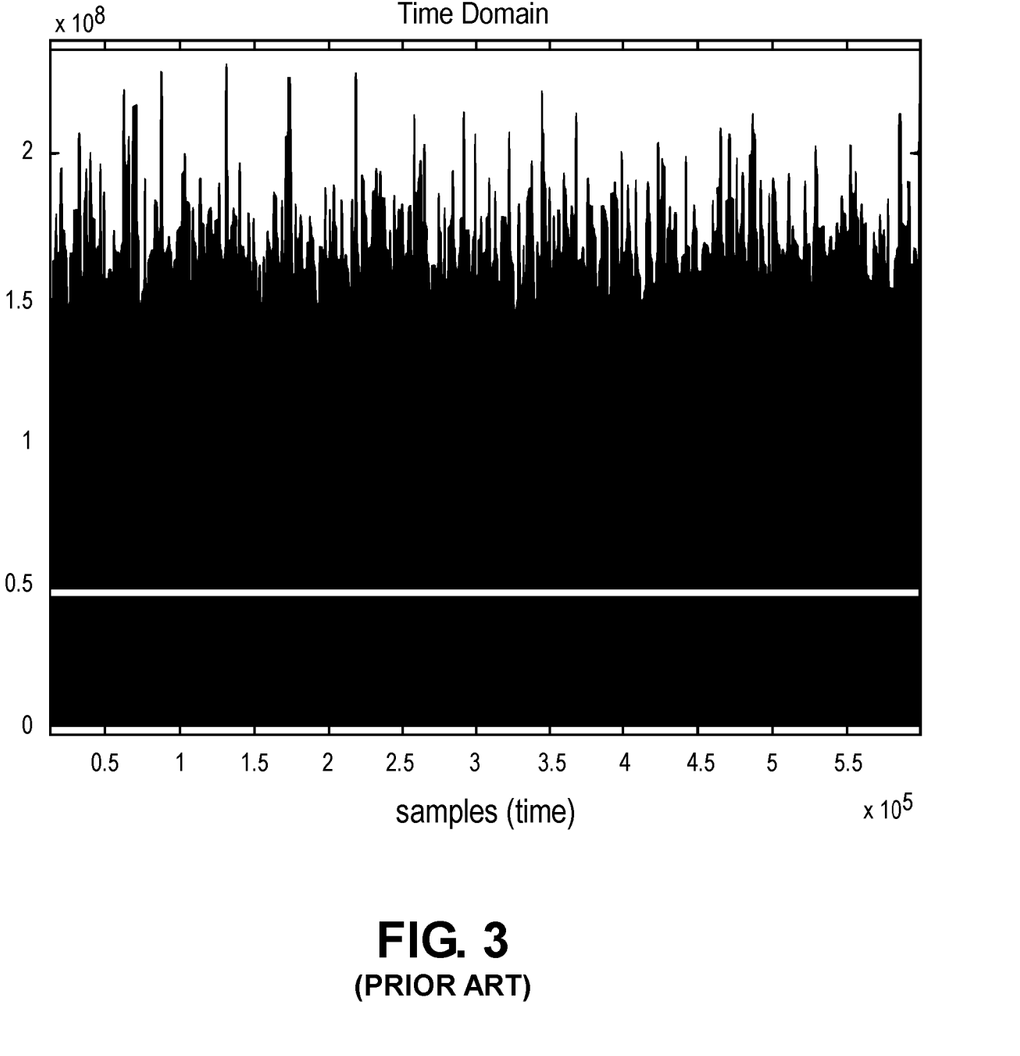
FIG. 3 is an absolute linear value plot of the same signal (ABS(CATV(t))) shown in FIG. 2 in accordance with the prior art.
Figure 4:
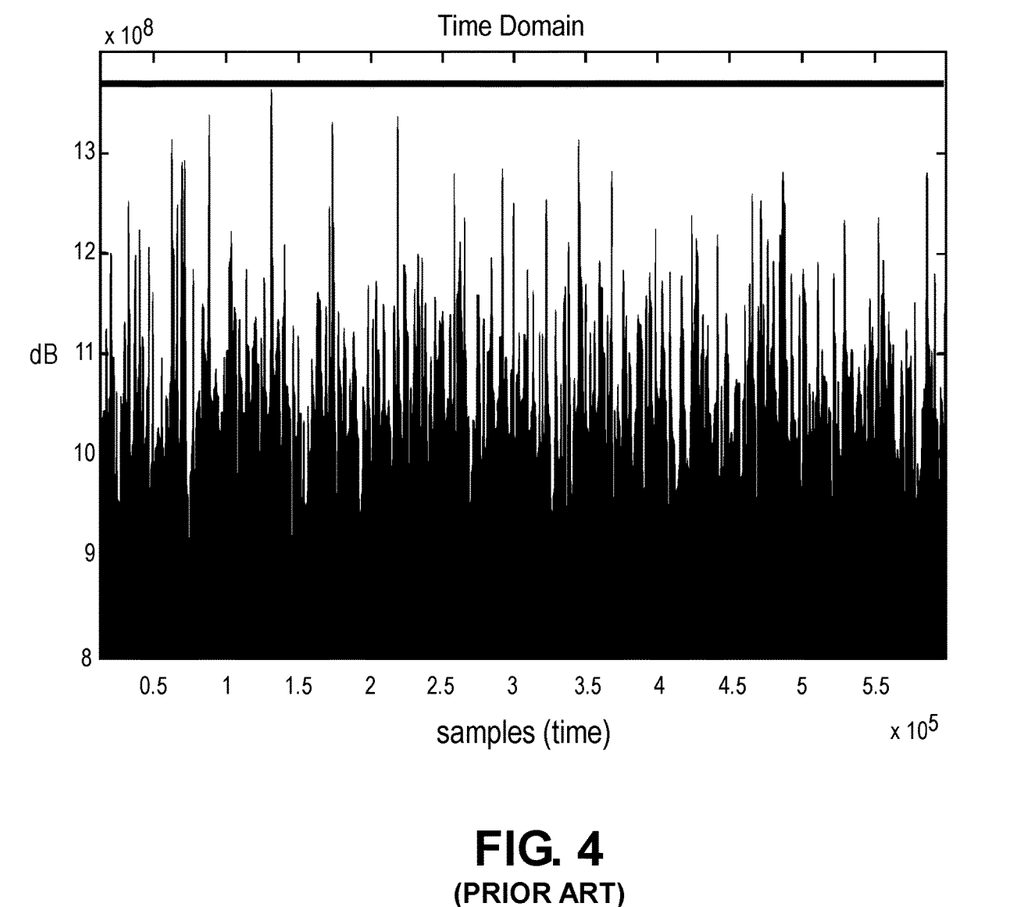
FIG. 4 depicts the same signal shown by FIG. 2 in logarithmic scale (20*log 10(ABS(CATV(t)))) in accordance with the prior art.
Figure 5:
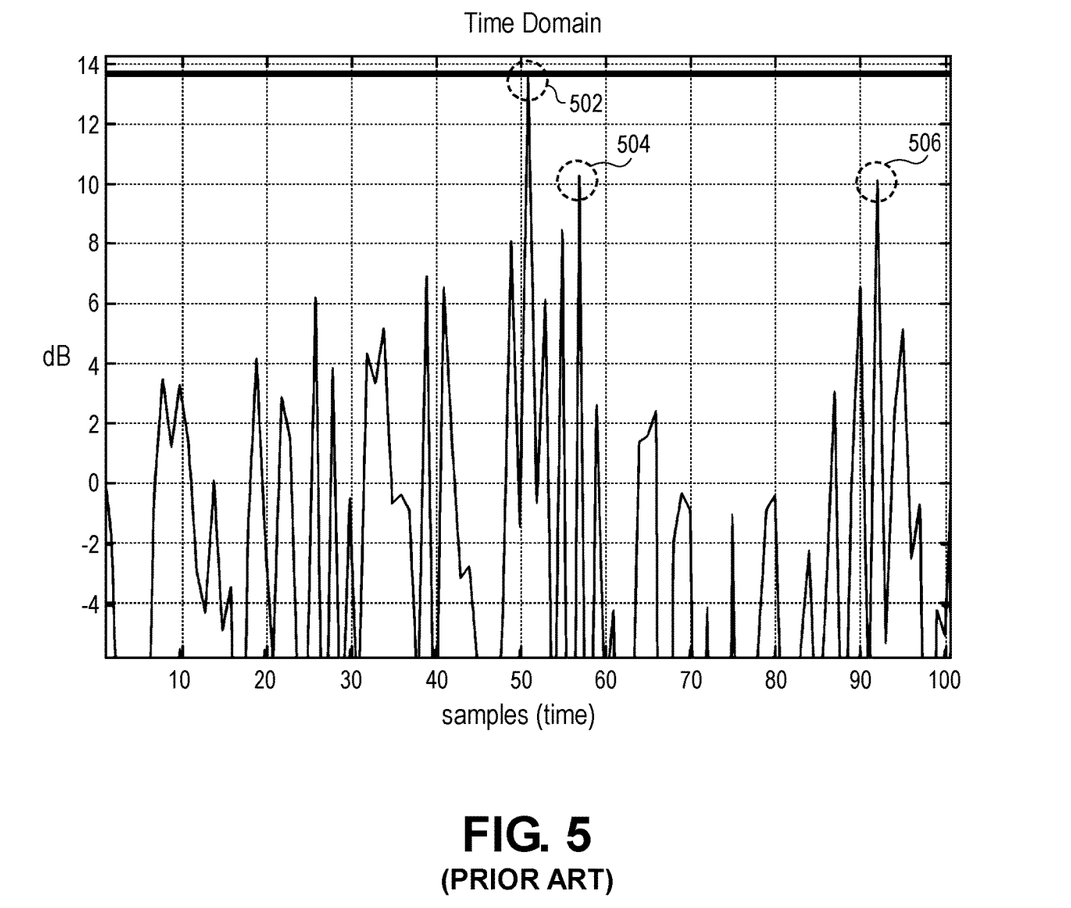
FIG. 5 depicts, in the CATV(t) signal of FIG. 2, 100 samples immediately near the highest PAPR in accordance with the prior art.

FIG. 3 is an absolute linear value plot of the same signal (ABS(CATV(t))) shown in FIG. 2 in accordance with the prior art. FIG. 4 depicts the same signal shown by FIG. 2 in logarithmic scale (20*log 10(ABS(CATV(t)))) in accordance with the prior art. FIG. 4 is scaled with the RMS value at 0 dB and depicting values which are higher than 8 dB above the RMS value. FIG. 5 depicts, in the CATV(t) signal of FIG. 2, 100 samples immediately near the highest PAPR in accordance with the prior art. As can be appreciated from viewing FIG. 5, although the probability of a very high peak is low, it is typical to find several other high (but slightly lower) peaks not far in value and separated by several samples from the very high instantaneous peak. Specifically, in the signal depicted by FIG. 5, two high peaks, namely peaks 504 and 506, are about 4 dB lower than the highest peak of peak 502, which is at ~14 dB. Peaks 504 and 506 occur in the signal very close to highest peak 502.

Figure 6:
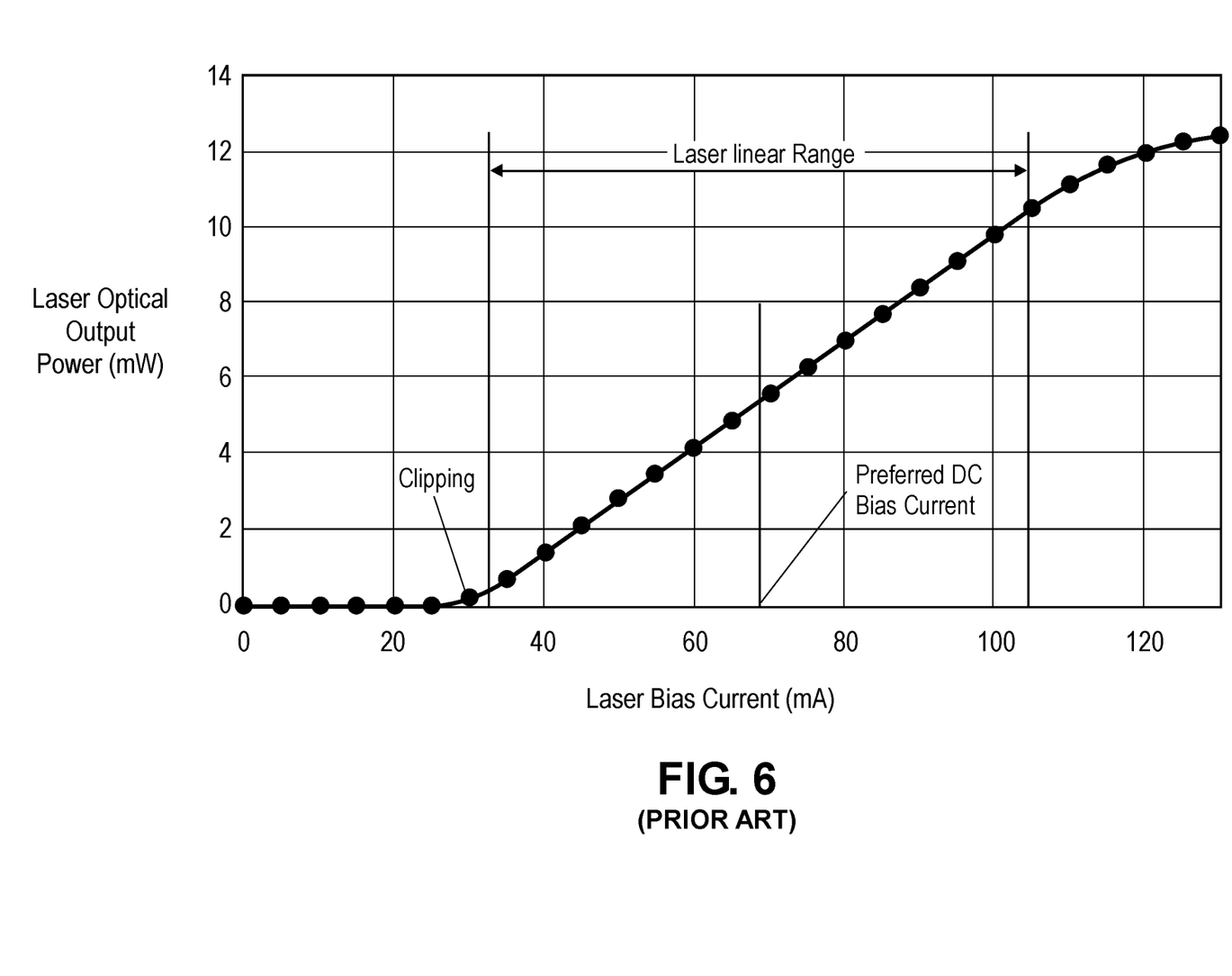
FIG. 6 is a graph of laser bias current vs. optical output power in accordance with the prior art.

In Hybrid Fiber Coax (HFC) systems, distributed feedback lasers (DFB) are often used to transport and distribute Cable TV signals across large distances, beyond the capabilities of electrical coaxial cables. When used to convey a wide RF spectrum of modulated CATV signals, these lasers are biased with a certain DC bias current, such that when combined with the modulating RF signal, the total current to the laser stays in the linear zone for any "reasonable" RF momentary current. Since the RF signal is typically symmetrical in amplitude, the preferred DC current bias is in the middle of the laser linear zone, and the preferred RF signal current will be adjusted in amplitude such that the range of laser current stays in the laser linear zone. To illustrate, FIG. 6 is a graph of laser bias current vs. optical output power in accordance the prior art. As shown in FIG. 6, the preferred DC current bias is in the middle of the laser linear zone.

As is typical in a CATV high PAPR signal, there may be the presence of large PAPR instantaneous RF signal peaks that have a low probability of occurring. Such large PAPR instantaneous RF signal peaks will cause the total laser current to be either lower or higher than the laser linear range. In response to such occasions, the laser will produce undesirable non-linear distortions. These distortions will grow in amplitude as the total current increases beyond the laser linear range.

It is often desirable to drive higher RF amplitude into the laser, and by that increase the optical modulated index (OMI) of the signal, which often results in improved signal reception quality at the receiver. At the same time, there exists graceful degradation in the laser linearity when the RF signal amplitude grows and drives the laser further outside its linear range. Since the probability of very high PAPR RF instantaneous peaks occurring is very low, the average non-linearity may also be very low, but instantaneous high non-linearity events may cause bit errors in signal demodulation. Thus, a compromise is often employed to balance the desired high OMI with an acceptable level and probability of laser non-linearity.

Nevertheless, if at any time the RF signal instantaneous amplitude is over a certain threshold (that threshold being an amplitude which causes the sum of bias current plus RF signal current to be less than a certain value required for the laser to emit light, i.e., "the clipping point" or "clipping threshold"), a catastrophic event occurs. The laser stops lasing for a very short duration of time associated with the duration of the instantaneous very large RF signal peak. When the instantaneous signal goes below that threshold after the very short duration of time (often measured in picoseconds), the laser starts lasing again.

However, the laser lost its light coherency during that short interruption in lasing. It takes a relatively long time for the laser to regain its light coherency. This coherency recovery time length is often several orders of magnitude longer than the length of time of which the signal instantaneous amplitude was above the "clipping threshold." During the coherency recovery time, while the laser light may be modulated by the required signal, the wavelength of the light is outside the allowable range. Thus, there exists a very large and long signal error in the actual received light relative to the expected received light until the laser again regains coherency and its signal is again properly receivable by the intended receiver. In fact, the loss of light coherency creates a "memory effect," where the high PAPR extreme event condition is "remembered" for a time by the laser, and for a time, the laser output is still affected by the extreme event even after the event cause is removed from the laser input.

As a result of the laser clipping effect, often the maximum OMI of the laser is not limited by the "regular" non-linear distortion that results from operating the laser slightly outside its linear zone, but rather from the probability that a large PAPR instantaneous RF signal peak will cause the laser to lose light coherency. This is so because such elongated signal error periods are much more likely to cause bit errors at the receiver and the demodulator than the relatively small non-linearity.

A prior art approach uses pre-clipping of the RF signal before it is applied to the laser. By pre-clipping the signal, the instantaneous signal amplitude is limited to amplitudes below a certain pre-clipping value, and thus is forced to be lower than the value that will cause the laser to stop lasing. Since laser clipping is a unipolar effect (i.e., caused only by negative polarity high RF signal peaks), the pre-clipping implementation only has to limit the RF signal negative peaks and not its positive peaks.

To ensure some operating margin that will ascertain the prevention of clipping at the laser, the amplitude of the "deliberate signal error" created by the pre-clipping operation will typically be slightly larger than the extent of the instantaneous signal excursion beyond the laser clipping point if the pre-clipping is not applied. However, the pre-clipping mechanism is designed to be very fast reacting, and the signal error duration is limited to the time length in which the instantaneous signal is higher in amplitude than the pre-clipping threshold. That potentially larger amplitude "deliberate signal error" is orders of magnitude shorter in duration than the signal error that results from clipping of the laser and the subsequent ceasing of the lasing of the laser which causes the laser to lose its laser light coherency.

Since the signal receiver and demodulator typically integrate the received signal over a time period, which is typically orders of magnitude longer than the length of time of the large PAPR instantaneous peak events, the receiver will typically encounter a signal error which is orders of magnitude smaller when pre-clipping is utilized, relative to the signal error encountered when the laser ceases lasing. This vastly improves the bit error rate (BER) performance achieved by the receiver/demodulator, which is strongly affected by sporadic events of high signal error (burst noise), and results in an improved performance of the whole optical communication link.

When a pre-clipping scheme is implemented on the RF signal applied to the laser, often the maximum OMI achievable by the laser can be substantially higher than that possible without a pre-clipping scheme, thus increasing the laser effective RF modulated output power, while maintaining a similar total non-linear distortion and/or BER at the receiver and demodulator receiving the laser output signal. Alternatively, the same OMI can be used, but with substantially reduced non-linear distortion and/or BER. Thus, applying pre-clipping in an RF communication laser transmitter may improve the operating dynamic range of the optical communication link by removing the memory effect associated with laser clipping.

Any practical electronic system, such as an RF power amplifier (RFPA), has a limited dynamic range, and thus it may introduce noise and distortion to the signal it processes when the signal is outside of that dynamic range. While the largest possible dynamic range, or often in the RFPA case the largest possible output power, is desirable to reduce noise in the overall system, the dynamic range is often limited due to RFPA generated distortions, power consumption, cost, the available technology, and other constraints.

The signal amplitude applied to the typical RFPA is adjusted such that the average (or RMS) power value is suitable to the capability of the RFPA to operate without generating distortions above an acceptable level. That adjustment typically targets a certain probability for the signal PAPR peak to be higher than the RFPA maximum possible amplitude. That RFPA maximum possible amplitude is the amplitude of the RF signal at the RFPA output beyond which the RFPA produces a catastrophic degradation in the amount of RF signal distortion.

In a prior art RFPA, when a very high PAPR instantaneous signal peak occurs that is above the RFPA maximum possible amplitude, a signal error is introduced to the signal at the output of the RFPA. Such a signal error may manifests itself as a wide band noise that spreads over the in-band operating bandwidth of the communicating device, as such signal errors are often restricted from also affecting the out-of-band frequency range by the use of analog blocking filters. The need to prevent these low probability of occurring peaks from creating noise events in-band and out-of-band is a motivation to set the RF signal amplitude such that the signal RMS level for that RF signal is at a relatively large back-off level relative to the RFPA maximum possible amplitude for the RFPA.

However, given that the RFPA maximum possible amplitude is a trait of the RFPA, the higher the RMS signal back-off is from the RFPA maximum possible amplitude, the lower the RF signal output power achievable by the RFPA. Thus, there typically is an optimization implemented to compromise between the large PAPR value exceeding the RFPA maximum possible amplitude (which creates a short duration broadband noise event as explained above) which have a low likelihood of occurring and the overall maximum output power achievable by the RFPA.

It is desirable to increase the RFPA maximum possible amplitude to enable the handling of very high PAPR signals while keeping the broadband noise generated by those signals' peaks very low relative to the RF signal RMS value. However, there are limitations in available technology to achieve this goal. Given the state of semiconductor technology, there is a steep trade off in energy efficiency (power consumption) or distortion level to achieve even a small increase in RFPA possible RF signal output power.

Several traits of an RF power amplifier (RFPA) behavior are similar to the DFB laser. An RFPA typically has a linear operating range that generates little non-linear distortions and is typically DC biased such that when the RF signal is applied, the total signal generally stays inside the linear RFPA range. When the instantaneous total input (DC bias plus RF signal) goes outside the linear zone, there exists graceful linearity degradation, in which the further the instantaneous total input signal departs from the linear zone, the more undesirable non-linear distortions are generated by the RFPA.

Unlike the DFB laser, the RFPA linear range is typically only bound in the lower input side of the graph. Setting a higher DC operating bias can increase the span of the RFPA linear operating range, but increases the power consumption of the RFPA. Similarly, increasing the power supply voltage applied to the RFPA can increase the top range of the RF signal output from the RFPA, but that too increases the power consumption of the RFPA. Thus, a tradeoff exists between the desire to reduce power consumption (RFPA DC current bias and power supply voltage), and achieve the maximum RF output power, while maintaining an output signal with a certain desirable maximum distortion level.

As with a DFB laser, when the instantaneous input signal is larger than a certain level, a RFPA may experience a clipping-like abrupt catastrophic deterioration in linearity, generating a very large amount of non-linear distortions. The input signal level that causes the large amount of non-linear distortions is directly associated with the RFPA output RF signal maximum possible amplitude. Depending on the construction of the RFPA, there can also exist a memory effect in the reaction of the RFPA to an extreme instantaneous input signal. This memory effect may be caused by several different physical phenomena. For example, the instantaneous extreme input signal may result in tearing down a depletion region required for an amplifier's operation. That depletion region may take much longer to be rebuilt, after the input returns to normal condition, than the duration of the high PAPR instantaneous input signal peak itself. During the time that the depletion region is incomplete, the RFPA response (e.g., gain) severely differs from its normally expected behavior such that the actual output signal contains a large signal error relative to the expected output signal.

In this way, a very short instantaneous departure of the RF input signal from acceptable range causes a memory effect, stretching the length of time that signal error and/or non-linear distortions appear at the RFPA output. A very short instantaneous departure of the RF input signal from an acceptable range may also severely increase signal error and/or non-linear distortions' magnitude.

Figure 7:
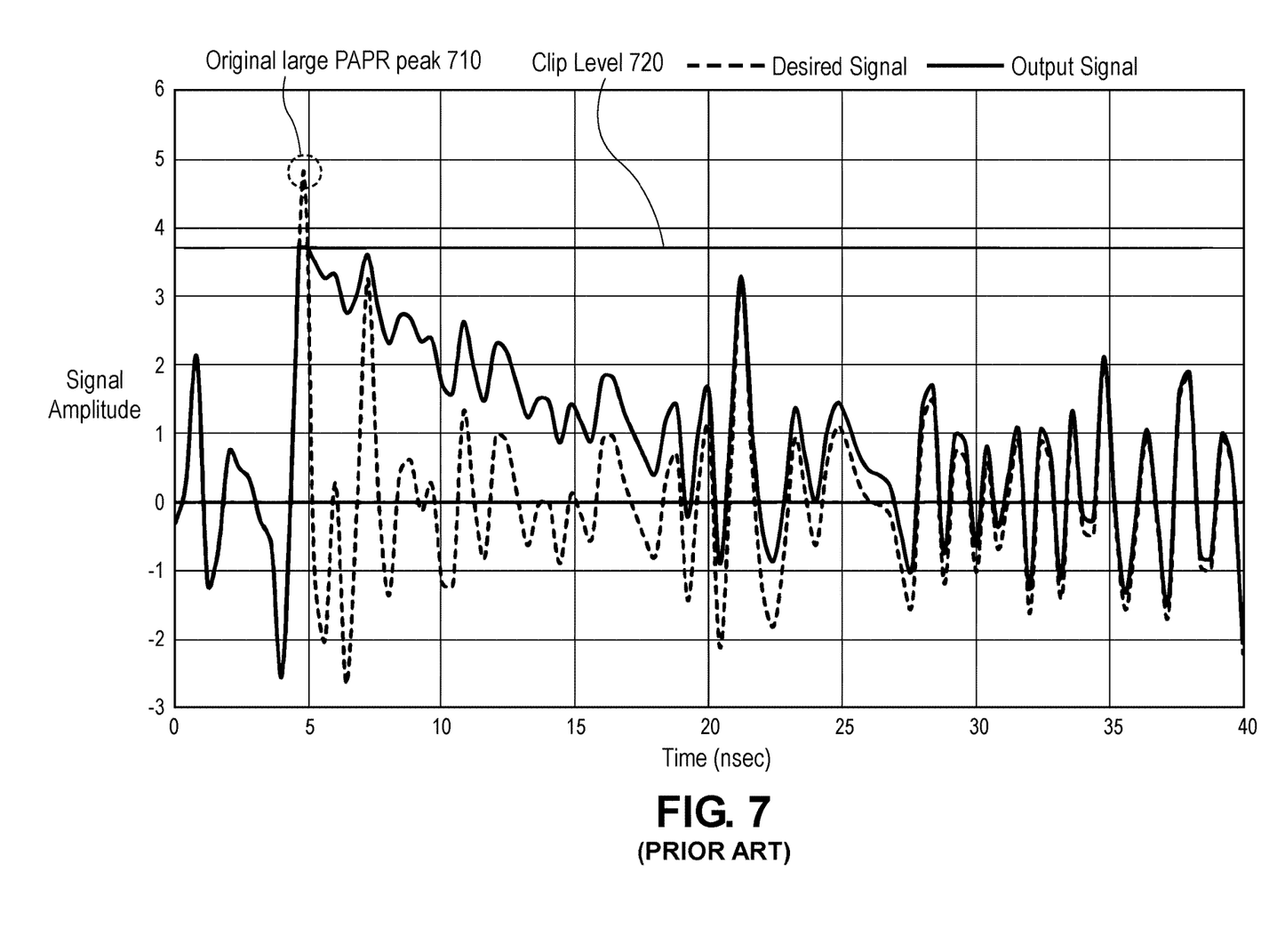
FIG. 7 is a plot of desired and actual RF signals at the output of an RFPA during a clipping induced memory effect in accordance with the prior art.

FIG. 7 is a plot of desired and actual RF signals at the output of an RFPA during a clipping induced memory effect in accordance with the prior art. As shown in FIG. 7, original large PAPR peak 710 exceeds clip level 720. After original large PAPR peak 710, the output signal deviates from the desired signal for some time in response to original large PAPR peak 710 exceeding clip level 720.

BRIEF DESCRIPTION OF THE DRAWINGS

Embodiments of the invention are illustrated by way of example, and not by way of limitation, in the figures of the accompanying drawings and in which like reference numerals refer to similar elements and in which.

DETAILED DESCRIPTION OF THE INVENTION

Approaches for preventing RF signal distortion and signal error producing memory events in a Radio Frequency (RF)

power amplifier (RFPA) are presented herein. In the following description, numerous specific details are set forth in order to provide a thorough understanding of the embodiments of the invention described herein. It will be apparent, however, that the embodiments of the invention described herein may be practiced without these specific details. In other instances, well-known structures and devices are shown in block diagram form or discussed at a high level in order to avoid unnecessarily obscuring teachings of embodiments of the invention.

Embodiments of the invention may be employed in a variety of contexts involving the transmission of RF signals that are susceptible to RF signal distortion and signal error producing memory events. For example, embodiments may be employed within a communication device operable within a Hybrid Fiber Coax (HFC) system. Other embodiments of the invention may be employed outside of a HFC system.

Embodiments of the invention discussed herein are directed towards the prevention of RF signal distortion and signal error producing memory events in a Radio Frequency (RF) power amplifier (RFPA). In an embodiment, an element, disposed prior to the Radio Frequency (RF) power amplifier (RFPA) in a signal path of a RF signal input to the RFPA, may enforce a maximum allowable amplitude in a high PAPR instantaneous high peak of the RF signal. In another embodiment, an element may also increase or supplement a bias of the Radio Frequency (RF) power amplifier (RFPA) when a high PAPR instantaneous high peak is detected in the RF signal prior to receipt by the RFPA. In a further embodiment, a first element operable detects when an instantaneous output voltage of the Radio Frequency (RF) power amplifier (RFPA) is below a predetermined voltage, and in response, a second element supplies additional current to prevent the output voltage of the RFPA from falling below a predetermined threshold voltage. These and other embodiments are discussed in greater detail herein.

An embodiment of the invention may operate to eliminate the instantaneous RF signal departure from an acceptable range by modifying the RF signal. This embodiment prevents the occurrence of memory-inducing clipping in the RFPA by 'pre-clipping' the RF signal before it is applied to the RFPA using a very fast (memory-less) element.

Figure 9:
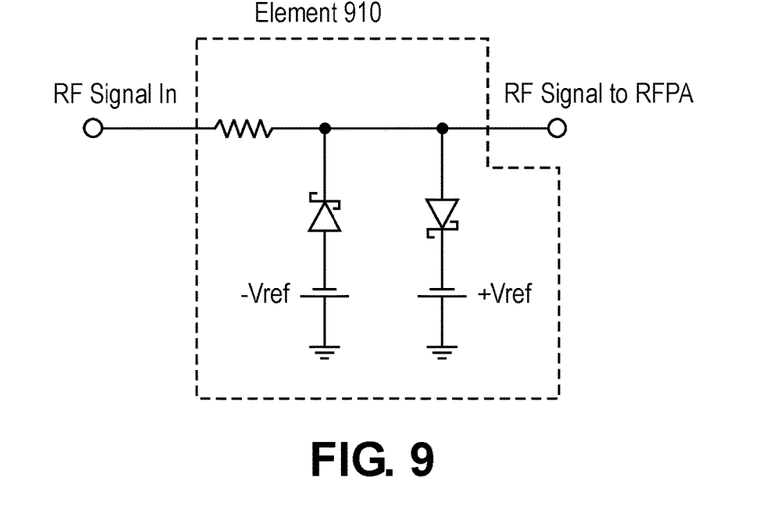
FIG. 9 is an illustration for an element that is capable of pre-clipping the RF signal in accordance with an embodiment of the invention.

Pre-clipping, or modification of the RF signal to ensure a predetermined amplitude is not exceeded, may be performed in various locations, e.g., pre-clipping may be performed in the analog domain or the digital domain. FIG. 9 is an illustration for element 910 that is capable of pre-clipping the RF signal in the analog domain in accordance with an embodiment of the invention. Element 910 pre-clips the RF signal in the analog RF domain using a pair of Schottky diodes as shown in FIG. 9.

Figure 10:
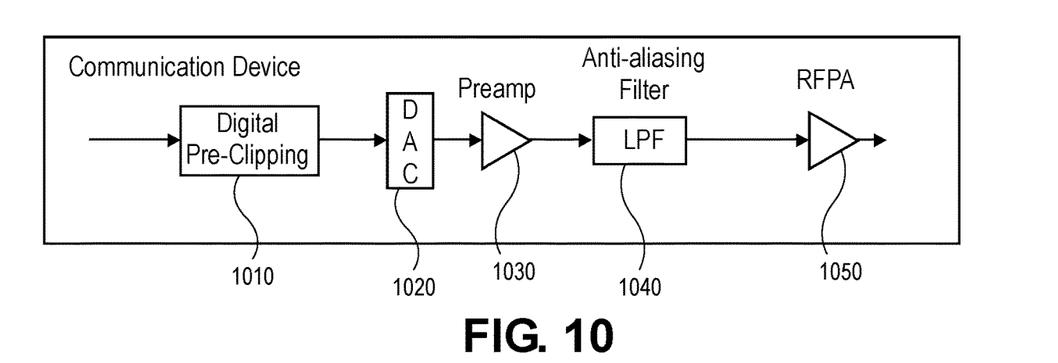
FIG. 10 is an illustration for an element that is capable of pre-clipping the RF signal in the digital domain in accordance with an embodiment of the invention.

FIG. 10 is an illustration for element 1010 that is capable of pre-clipping the RF signal in the digital domain in accordance with an embodiment of the invention. As shown in FIG. 10, digital pre-clipping element 1010 performs pre-clipping of the RF signal in the digital domain prior to the digital-to-analog conversion of the RF by DAC 1020. Digital pre-clipping element 1010 should consider various signal conditioning elements that may be included in the communication device RF path between DAC 1020 and RFPA 1050, such as an anti-aliasing filter 1040 commonly used after DAC 1020 and/or a preamplifier 1030.

Embodiments may perform a pre-clipping operation by initially establishing a pre-clipping level (a threshold). The pre-clipping level or threshold can be devised such that it directly corresponds to the level of the RF signal at the RFPA that causes the catastrophic memory event (e.g., considering the RF signal gain in the system and other effects). Unlike in DFBs, since RFPAs are often constructed with dual amplifiers arranged in a differential push-pull structure, it is most often required to implement a symmetrical pre-clipping scheme in which both negative and positive RF peaks are limited to a certain predetermined amplitude that will prevent both sides of the differential RFPA from clipping. The positive edge pre-clipping prevents clipping in one of the differential amplifiers within the RFPA, and the negative edge pre-clipping prevents clipping in the other amplifier within the RFPA.

Elements that perform pre-clipping should be fast reacting, such that those elements not only react fast enough to clip high peaks without letting any signal amplitudes above the predetermined level proceed to the RFPA, but also restore the output signal to its intended level immediately after the RF signal goes below the predetermined level, thus creating no memory effect.

Performing pre-clipping on the RF signal prior to the RF signal being propagated to the RFPA results in a signal error at the input to the RFPA whenever an instantaneous high PAPR peak is higher than the pre-clipping threshold. At the actual time that a pre-clipping element is operational, the signal error that the pre-clipping element generates may be even slightly larger than the signal error that would have been generated by the RFPA if pre-clipping was not performed. This is so because an implementation margin may be needed to make sure that the RFPA clipping will not occur. However, the signal error resulting from a pre-clipping operation is limited to a very short duration and is not extended by an RFPA memory effect. Accordingly, the overall integrated error created by the pre-clipping performed by an embodiment can be several orders of magnitude smaller than if embodiments did not perform pre-clipping.

Figure 8:
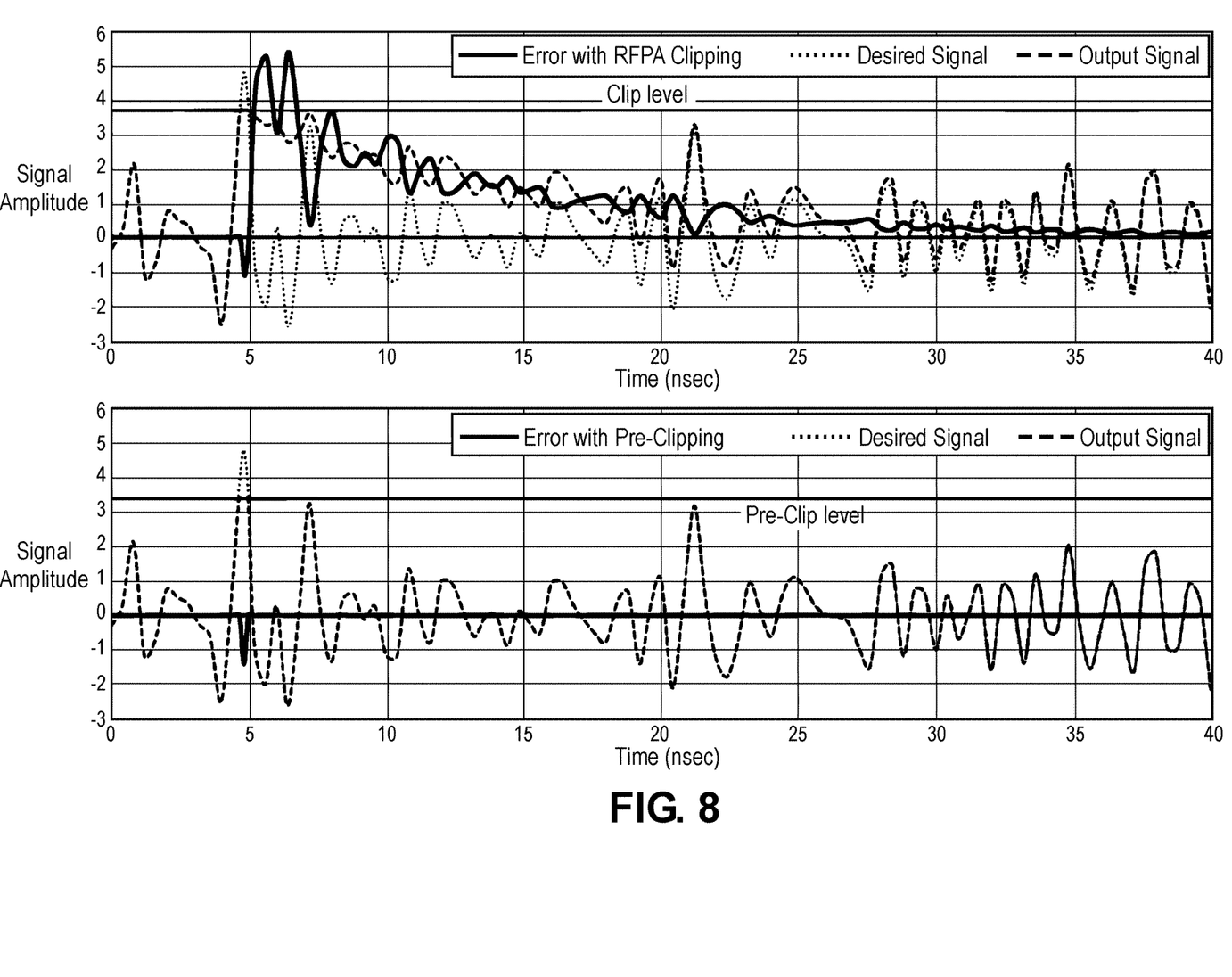
FIG. 8 is a graph that compares the signal error created by clipping at an RFPA due to the difference between the desired and actual RF signals at the output of an RFPA during a clipping induced memory event vs. the signal error created by a pre-clipping memory-less mechanism in accordance with an embodiment of the invention.

FIG. 8 is a graph that compares the signal error created by clipping at an RFPA due to the difference between the desired and actual RF signals at the output of an RFPA during a clipping induced memory event vs. the signal error created by a pre-clipping memory-less mechanism in accordance with an embodiment of the invention. As shown in FIG. 8, the signal error produced by the performance of the pre-clipping operation (the lower graph) is slightly larger than the signal error that would have been generated by the RFPA if pre-clipping was not performed (the upper graph). However, the upper graph demonstrates that the signal error generated by the RFPA if pre-clipping was not performed persists for a substantial longer duration than that shown in the lower graph in FIG. 8.

The bit error rate (BER) experienced at a receiver/demodulator which receives the RF signal delivered by the RFPA is affected by the integrated signal error duration. Accordingly, a very short signal error event (resulting from clipping prevention obtainable by an embodiment) has a much smaller effect on the receiver than the effect of a stretched signal error due to the memory effect of a clipped amplifier (as experienced by the prior art). Thus, clipping prevention of an embodiment results in improving the robustness of the transmission link and can largely lower the probability that a very high PAPR peak event in the RF signal will result in creating bit errors at the receiver/demodulator.

Alternatively, the reduction in the amount of signal error in the RFPA output enabled by a clipping prevention scheme of an embodiment may instead be traded off with reducing the back off enacted relative to the RFPA maximum possible amplitude for purposes of increasing the RMS signal level at the RFPA. Doing so results in more events where a large peak PAPR signal passes the pre-clipping threshold (due to the higher likelihood of such events coupled with the lower back off), and thus more events of signal error are generated by the pre-clipping element, and with even higher excursion of the large peak PAPR over the pre-clipping level than before. However, due to the lack of a memory effect and the short duration of these signal errors, the total resulting receiver BER can be maintained at sufficiently low levels, thus resulting in acceptable reception performance at the receiver. Thus, the clipping prevention performed by an embodiment can allow for increasing the RF signal output power without consuming more power at the RFPA (improving RFPA power efficiency), resulting in power saving and without worsening the whole system's BER.

Embodiment of the invention may also operate to prevent RF signal distortion and signal error producing memory events in a Radio Frequency (RF) power amplifier (RFPA) by using an element to increase or supplement a bias of a Radio Frequency (RF) power amplifier (RFPA) when a high PAPR instantaneous high peak is detected in the RF signal prior to receipt by the RFPA. In contrast to embodiments which modify the RF signal to eliminate high PAPR instantaneous high peaks of the RF signal, certain embodiments prevent the RFPA from encountering a catastrophic memory event by ensuring the RFPA does not exit its intended operational range (i.e., its dynamic range) and does not enter a non-operating condition. In this way, the memory effect associated with an undesirable delay in reentering the desired operating position is avoided. To furtherance of this goal, embodiments may momentarily increase or supplement the normal bias circuit of the RFPA. That momentary bias increase or supplementation is designed to have negligible effect on the RFPA operation during normal operation and is only enacted whenever a high PAPR instantaneous high peak occurs.

Figure 11:
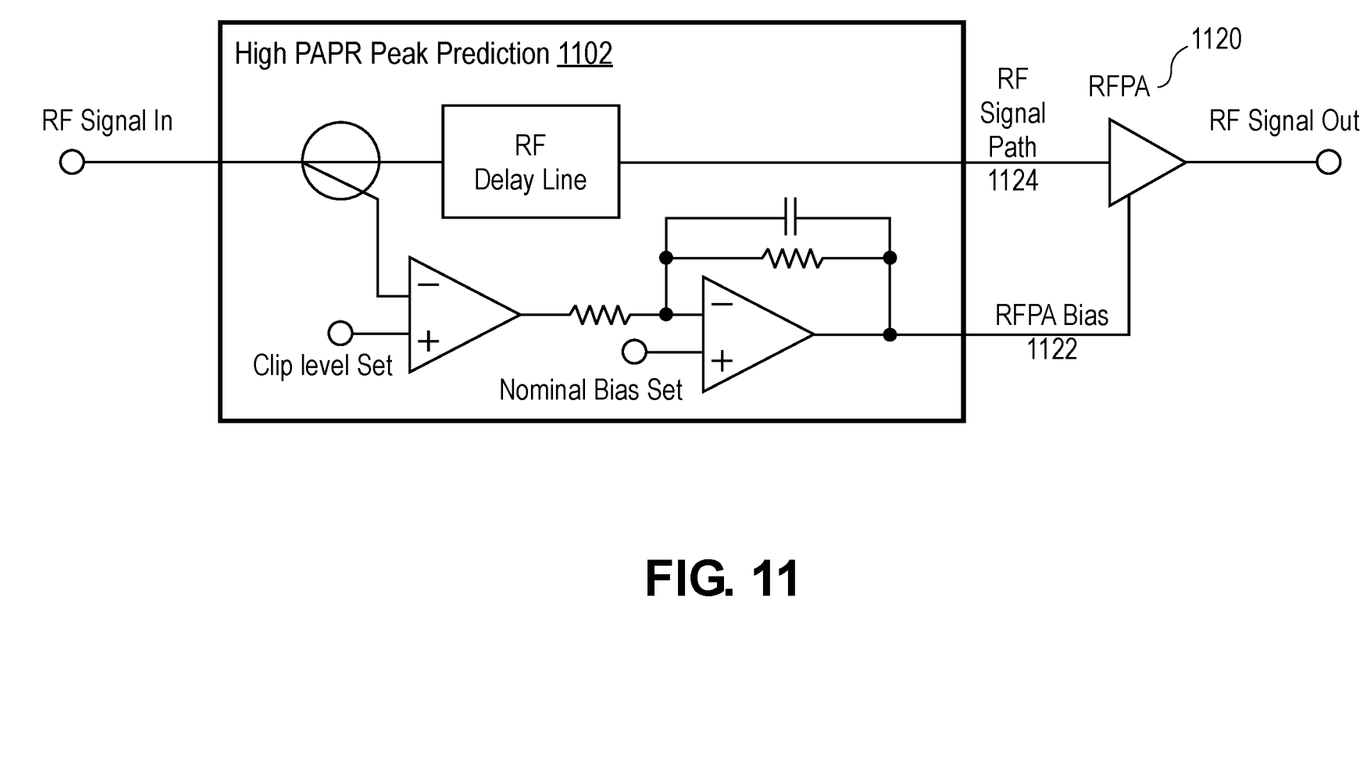
FIG. 11 is an illustration of a high PAPR peak prediction element that momentarily increases or supplements the normal bias circuit of a RFPA to prevent the RFPA from encountering a catastrophic memory event in accordance with an embodiment of the invention.

FIG. 11 is an illustration of high PAPR peak prediction element 1102 capable of momentarily increasing or supplementing the normal bias circuit 1122 of RFPA 1120 to prevent RFPA 1120 from encountering a catastrophic memory event in accordance with an embodiment of the invention. FIG. 11 depicts a direct modification of the RFPA DC bias 1122. RFPA DC bias 1122 is increased when a high PAPR instantaneous high peaks is detected in the input RF signal to RFPA 1120. Since the bias circuit of RFPA 1120 normally has a slower response than RF signal response, a delay can be added to the RF signal to permit the bias increase to come into effect by the time the detected high PAPR peak reaches RFPA 1120. The high PAPR peak can be detected by sampling the RF signal using an RF coupler and comparing the RF signal to a predefined clip level above which the bias will be increased. The bias can be thus gradually increased (using a low pass filter) from its normal level to a boosted level and then reduced back to the normal level. Element 1102 will match the signal propagation delay in the two paths of the system (RF signal path 1124 and RFPA bias path 1122) such that the RFPA is biased at its peak when the high PAPR peak signal reaches RFPA 1120. While the length of time of increased bias to RFPA 1120 is considerably longer than the actual high PAPR instantaneous peak, a careful implementation of element 1102 can achieve negligible signal error generated during the entire time the bias to RFPA 1120 is increased, including the time of the high PAPR instantaneous peak itself.

The bias increase into RFPA 1120 also increases the power consumption of RFPA 1120. However, that power consumption increase is of short duration, and since high PAPR events have a low probability of occurring and are typically spaced enough apart in time, the average power consumption increase can be negligible. The momentary power increase can be supplied by a DC-line capacitor, or other like sources, so that the power supply which provides power to the RFPA experiences negligible additional load during the time that the bias is increased.

FIG. 11 depicts bias modification for a single bias line only applied for a single peak polarity of high PAPR peak signals in accordance with an embodiment of the invention. However, since RFPA are often constructed with dual amplifiers arranged in a differential push-pull structure, an implementation can detect both positive and negative high PAPR peak signals to modify the bias of both differential amplifiers in an RFPA, or even detect positive high PAPR peak signals to modify the bias of one of the two differential amplifiers in an RFPA, and detect negative high PAPR peak signals to modify the bias of the other.

Embodiments of the invention may also operate to prevent RF signal distortion and signal error producing memory events in a Radio Frequency (RF) power amplifier (RFPA) by preventing the RFPA output voltage from dropping below a pre-determined value. Whether the RFPA is based on heterojunction bipolar transistor (HBT), metal-semiconductor field-effect transistor (MESFET), pseudomorphic high electron mobility transistor (pHEMT) or other transistor technologies with transistors arranged in cascode or other formations, the RFPA will typically exit its proper operation zone if, due to a high instantaneous signal peak in the RF signal, the instantaneous output voltage reaches below a certain voltage. This can happen due to transistor saturation, reversal of a gate-source voltage, or other reasons.

Figure 12:
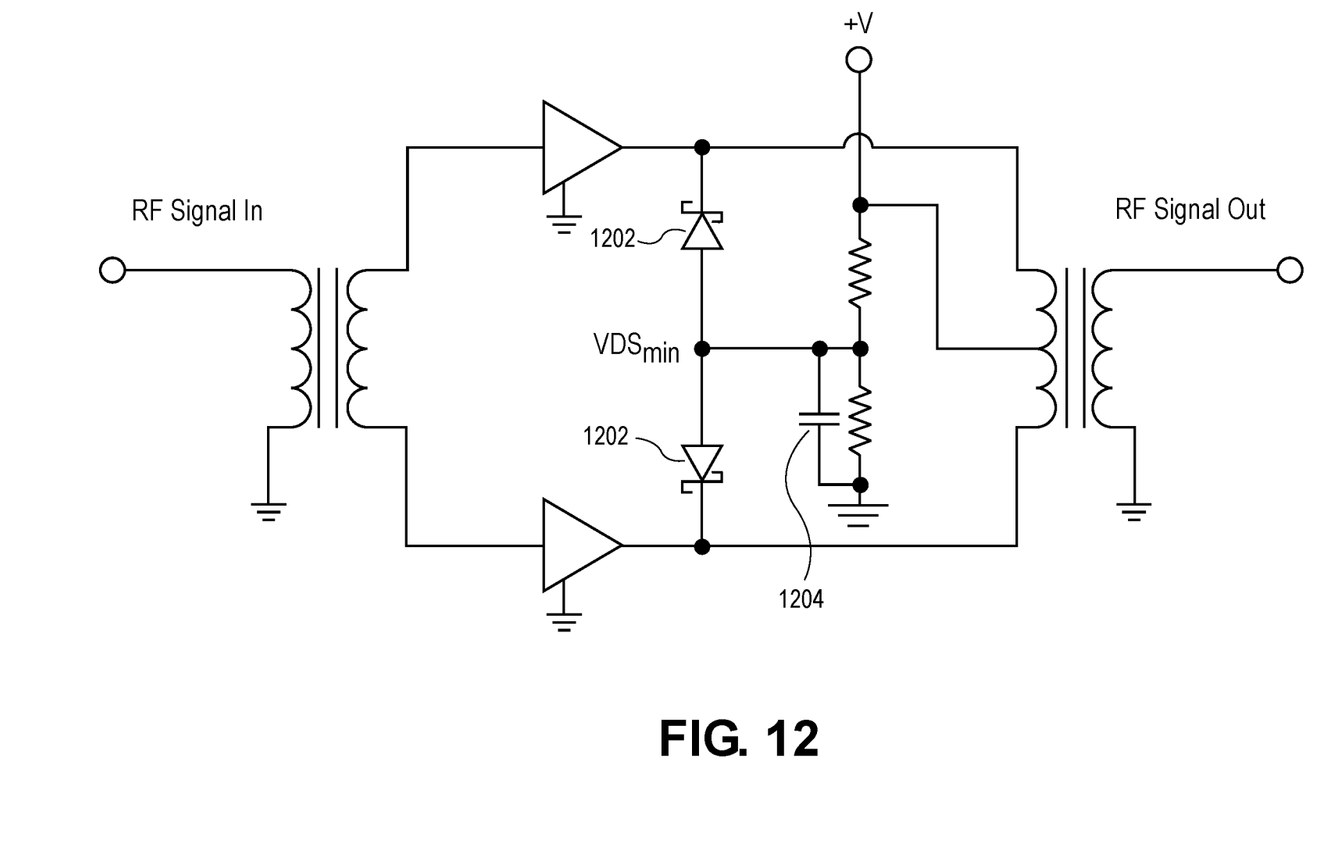
FIG. 12 is an illustration of an approach for preventing the RFPA output voltage from dropping below a pre-determined value in accordance with an embodiment of the invention.

FIG. 12 is an illustration of an approach for preventing the RFPA output voltage from dropping below a pre-determined value in accordance with an embodiment of the invention. FIG. 12 depicts an implementation that prevents a class-A differential push pull amplifier from reaching too low of an output voltage. A pair of fast acting diodes (e.g., Schottky diodes) 1202 is connected to the RFPA differential outputs. When an instantaneous high peak signal causes any of the RFPA outputs' voltage to drop below a predetermined voltage, $VDS_{min}$, maintained in this embodiment on capacitor 1204, the corresponding diode switches on and capacitor 1204 can supply the additional current required to keep the RFPA output voltage from dropping further, thus preventing the RFPA from exiting its operating zone.

Capacitor 1204 only needs to provide the additional current to the RFPA transistor for a very short duration (i.e., the duration of the instantaneous peak). Right after the peak duration, the required RFPA transistor current goes down, enabling the RFPA output voltage to rise above $VDS_{min}$, thus the diode turns back off. Capacitor 1204 may now slowly replenish its spent charge from the RFPA DC power line through a resistor network or other recharging means.

The length of time that additional current is provided to the RFPA is only so long as the high instantaneous signal peak duration, and that additional current is supplied by capacitor 1204. The average power consumption is negligibly affected, due to the slow capacitor charging process, and increases the demand from the DC power source in an insubstantial manner.

Although the RFPA itself does not enter a clipping related memory event, by not allowing the RFPA output voltage to go below $VDS_{min}$, an actual signal clipping is caused at the output of the RFPA amplifier. The duration of this signal clipping is similar to the duration of the large PAPR peak event, and it does create a very short duration of signal error at the RFPA output, similar in amplitude and duration to that signal error created by the pre-clipping scheme. Accordingly, embodiments of the invention that employ output voltage restriction present all the same benefits of the pre-clipping embodiments discussed above. For example, RFPA clipping prevention can result in improving the robustness of the transmission link by reducing BER at the receiver/demodulator. Alternatively, BER reduction can be traded off with increasing the RMS signal level at the RFPA, increasing the RF signal output power, without consuming more power at the RFPA, and without worsening the whole system's BER.

In the foregoing specification, embodiments of the invention have been described with reference to numerous specific details that may vary from implementation to implementation. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. An apparatus for preventing RF signal distortion and signal error producing memory events in a Radio Frequency (RF) power amplifier (RFPA), comprising:
   the Radio Frequency (RF) power amplifier (RFPA), wherein the RFPA resides in a communication device operable within a Hybrid Fiber Coax (HFC) system; and
   an element, disposed prior to the RFPA in a signal path of a RF signal input to the RFPA, operable to enforce a maximum allowable amplitude in a high peak to average power ratio (PAPR) instantaneous high peak of the RF signal.

2. The apparatus of claim 1, wherein the element does not experience the signal error producing memory events, and wherein said signal error producing memory events cause distortions in the RF signal over time in response to the RF signal having a high PAPR instantaneous high peak beyond a threshold amplitude.

3. The apparatus of claim 1, wherein the maximum allowable amplitude corresponds to a determined amplitude above which a signal error producing memory event is induced in said RFPA.

4. The apparatus of claim 1, wherein the maximum allowable amplitude is configured to be an amplitude that is less than a determined amplitude above which a signal error producing memory event is induced in said RFPA.

5. The apparatus of claim 1, wherein the maximum allowable amplitude is enforced in an analog domain.

6. The apparatus of claim 5, wherein the enforcement of the maximum allowable amplitude in the analog domain is performed using one or more Schottky diodes.

7. The apparatus of claim 5, wherein the enforcement of the maximum allowable amplitude in the analog domain is performed using a pair of Schottky diodes.

8. The apparatus of claim 1, wherein the maximum allowable amplitude is enforced in a digital domain prior to being received at a digital-to-analog converter (DAC).

9. An apparatus for preventing RF signal distortion and signal error producing memory events in a Radio Frequency (RF) power amplifier (RFPA), comprising:
   the Radio Frequency (RF) power amplifier (RFPA), wherein the RFPA resides in a communication device operable within a Hybrid Fiber Coax (HFC) system; and
   an element, disposed prior to the RFPA in a signal path of a RF signal input to the RFPA, operable to enforce a maximum allowable amplitude in a high peak to average power ratio (PAPR) instantaneous high peak of the RF signal,
   wherein the maximum allowable amplitude is enforced against both positive amplitude peaks and negative amplitude peaks of the RF signal.

10. An apparatus for preventing RF signal distortion and signal error producing memory events in a Radio Frequency (RF) power amplifier (RFPA), comprising:
    the Radio Frequency (RF) power amplifier (RFPA), wherein the RFPA resides in a communication device operable within a Hybrid Fiber Coax (HFC) system; and
    an element operable to increase or supplement a bias of the RFPA when a high peak to average power ratio (PAPR) instantaneous high peak is detected in the RF signal prior to receipt by the RFPA,
    wherein the element increases or supplements the bias of the RFPA gradually using a low pass filter from a normal level to an elevated level while the high PAPR instantaneous high peak is being processed by the RFPA, and wherein the element decreases the bias of the RFPA gradually from the elevated level to the normal level when the high PAPR instantaneous high peak is no longer being processed by the RFPA.

11. The apparatus of claim 10, wherein the element is a first element, and wherein the apparatus further comprises:
    a second element, disposed prior to the RFPA in a signal path of a RF signal input to the RFPA, operable to detect the high PAPR instantaneous high peak in the RF signal by comparing a measured amplitude of the RF signal to a predetermined amplitude.

12. The apparatus of claim 10, wherein said RFPA comprises a first amplifier and a second amplifier different than the first amplifier, and wherein the bias of each of the first and second amplifier is modified independently of the other.

13. An apparatus for preventing RF signal distortion and signal error producing memory events in a Radio Frequency (RF) power amplifier (RFPA), comprising:
    the Radio Frequency (RF) power amplifier (RFPA), wherein the RFPA resides in a communication device operable within a Hybrid Fiber Coax (HFC) system;
    a first element operable to detect when an instantaneous output voltage of the RFPA is below a predetermined voltage; and
    a second element operable to supply additional current to prevent the output voltage of the RFPA from falling below a predetermined threshold voltage.

14. An apparatus of claim 13, wherein the second element comprises a capacitor which recharges from a DC power line of the RFPA or another DC power line.

15. An apparatus of claim 13, wherein the first element comprises one or more Schottky diodes.

16. An apparatus of claim 13, wherein the second element supplies said additional current only over a duration commensurate to a length of time in which a RF signal that is input to the RFPA has a high PAPR instantaneous high peak beyond a threshold amplitude.

17. A method for preventing RF signal distortion and signal error producing memory events in a Radio Frequency (RF) power amplifier (RFPA), comprising:
an element, disposed prior to the Radio Frequency (RF) power amplifier (RFPA) in a signal path of a RF signal input to the RFPA, enforcing a maximum allowable amplitude in a high peak to average power ratio (PAPR) instantaneous high peak of the RF signal,
wherein the RFPA resides in a communication device operable within a Hybrid Fiber Coax (HFC) system.

18. A method for preventing RF signal distortion and signal error producing memory events in a Radio Frequency (RF) power amplifier (RFPA), comprising:
an element increasing or supplementing a bias of the Radio Frequency (RF) power amplifier (RFPA) when a high PAPR instantaneous high peak is detected in the RF signal prior to receipt by the RFPA,
wherein the RFPA resides in a communication device operable within a Hybrid Fiber Coax (HFC) system,
wherein the element increases or supplements the bias of the RFPA gradually using a low pass filter from a normal level to an elevated level while the high PAPR instantaneous high peak is being processed by the RFPA, and wherein the element decreases the bias of the RFPA gradually from the elevated level to the normal level when the high PAPR instantaneous high peak is no longer being processed by the RFPA.

19. A method for preventing RF signal distortion and signal error producing memory events in a Radio Frequency (RF) power amplifier (RFPA), comprising:
a first element operable to detect when an instantaneous output voltage of the Radio Frequency (RF) power amplifier (RFPA) is below a predetermined voltage; and
in response to the first element detecting that instantaneous output voltage of the RFPA is below a predetermined voltage, a second element operable to supply additional current to prevent the output voltage of the RFPA from falling below a predetermined threshold voltage,
wherein the RFPA resides in a communication device operable within a Hybrid Fiber Coax (HFC) system.

20. The method of claim 18, wherein the element does not experience the signal error producing memory events, and wherein said signal error producing memory events cause distortions in the RF signal over time in response to the RF signal having a high PAPR instantaneous high peak beyond a threshold amplitude.

* * * * *